United States Patent
Li et al.

(10) Patent No.: US 6,828,683 B2
(45) Date of Patent: *Dec. 7, 2004

(54) SEMICONDUCTOR DEVICES, AND SEMICONDUCTOR PROCESSING METHODS

(75) Inventors: Weimin Li, Boise, ID (US); Zhiping Yin, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,041

(22) Filed: Dec. 23, 1998

(65) Prior Publication Data

US 2002/0020919 A1 Feb. 21, 2002

(51) Int. Cl.[7] ............................................. H01L 23/48
(52) U.S. Cl. .................. 257/759; 257/751; 257/762; 257/642; 438/687; 438/623; 438/794; 438/627
(58) Field of Search ................................ 257/759, 751, 257/762, 642, 386; 438/687, 623, 793, 794, 624, 627

(56) References Cited

U.S. PATENT DOCUMENTS

| | | |
|---|---|---|
| 4,158,717 A | 6/1979 | Nelson |
| 4,444,617 A | 4/1984 | Whitcomb |
| 4,474,975 A | 10/1984 | Clemons et al. ............ 556/410 |
| 4,552,783 A | 11/1985 | Stoll et al. |
| 4,562,091 A | 12/1985 | Sachdev et al. |
| 4,600,671 A | 7/1986 | Saitoh et al. |
| 4,648,904 A | 3/1987 | DePasquale et al. |

(List continued on next page.)

FOREIGN PATENT DOCUMENTS

| | | |
|---|---|---|
| EP | 0 464515 | 1/1992 |
| EP | 0 471185 | 2/1992 |
| EP | 0 588087 A3 | 3/1994 |
| EP | 0 588087 A2 | 3/1994 |
| EP | 0 778496 | 5/1996 |
| EP | 0 771886 | 5/1997 |
| EP | 0 942330 | 9/1999 |

(List continued on next page.)

OTHER PUBLICATIONS

English abstract for JP–406244172–A.*

U.S. application No. 09/146,843, Li et al., filed Sep. 3, 1998.

U.S. application No. 09/030,618, Yin et al., filed Feb. 25, 1998.

(List continued on next page.)

*Primary Examiner*—Tom Thomas
*Assistant Examiner*—N. Drew Richards
(74) *Attorney, Agent, or Firm*—Wells St. John P.S.

(57) ABSTRACT

In one aspect, the invention encompasses a semiconductor processing method wherein a conductive copper-containing material is formed over a semiconductive substrate and a second material is formed proximate the conductive material. A barrier layer is formed between the conductive material and the second material. The barrier layer comprises a compound having silicon chemically bonded to both nitrogen and an organic material. In another aspect, the invention encompasses a composition of matter comprising silicon chemically bonded to both nitrogen and an organic material. The nitrogen is not bonded to carbon. In yet another aspect, the invention encompasses a semiconductor processing method. A semiconductive substrate is provided and a layer is formed over the semiconductive substrate. The layer comprises a compound having silicon chemically bonded to both nitrogen and an organic material.

38 Claims, 3 Drawing Sheets

U.S. PATENT DOCUMENTS

| | | |
|---|---|---|
| 4,695,859 A | 9/1987 | Guha et al. |
| 4,702,936 A | 10/1987 | Maeda et al. |
| 4,755,478 A | 7/1988 | Abernathey et al. |
| 4,764,247 A | 8/1988 | Leveriza et al. |
| 4,805,683 A * | 2/1989 | Magdo et al. ............... 156/643 |
| 4,833,096 A | 5/1989 | Huang et al. ................. 437/43 |
| 4,863,755 A | 9/1989 | Hess et al. |
| 4,870,470 A | 9/1989 | Bass, Jr. et al. |
| 4,910,160 A | 3/1990 | Jennings et al. |
| 4,940,509 A | 7/1990 | Tso et al. |
| 4,954,867 A | 9/1990 | Hosaka |
| 4,971,655 A | 11/1990 | Stefano et al. |
| 4,992,306 A | 2/1991 | Hochberg et al. |
| 5,034,348 A | 7/1991 | Hartswick et al. |
| 5,036,383 A | 7/1991 | Mori |
| 5,061,509 A | 10/1991 | Naito et al. |
| 5,140,390 A | 8/1992 | Li et al. |
| 5,219,613 A | 6/1993 | Fabry et al. |
| 5,234,869 A | 8/1993 | Mikata et al. |
| 5,244,537 A | 9/1993 | Ohnstein |
| 5,260,600 A | 11/1993 | Harada |
| 5,270,267 A | 12/1993 | Ouellet |
| 5,286,661 A | 2/1994 | de Fresart et al. |
| 5,302,366 A | 4/1994 | Schuette et al. |
| 5,312,768 A | 5/1994 | Gonzalez |
| 5,314,724 A | 5/1994 | Tsukune et al. |
| 5,340,621 A | 8/1994 | Matsumoto et al. |
| 5,356,515 A | 10/1994 | Tahara et al. |
| 5,376,591 A | 12/1994 | Maeda et al. |
| 5,405,489 A | 4/1995 | Kim et al. ................... 156/643 |
| 5,413,963 A | 5/1995 | Yen et al. |
| 5,429,987 A | 7/1995 | Allen |
| 5,439,838 A | 8/1995 | Yang |
| 5,441,797 A | 8/1995 | Hogan |
| 5,461,003 A | 10/1995 | Havemann et al. |
| 5,470,772 A | 11/1995 | Woo ............................ 437/43 |
| 5,472,827 A | 12/1995 | Ogawa et al. |
| 5,472,829 A | 12/1995 | Ogawa |
| 5,482,894 A | 1/1996 | Havemann |
| 5,536,857 A | 7/1996 | Narula et al. |
| 5,541,445 A | 7/1996 | Ouellet |
| 5,543,654 A | 8/1996 | Dennen |
| 5,554,567 A | 9/1996 | Wang |
| 5,591,494 A | 1/1997 | Sato et al. |
| 5,591,566 A | 1/1997 | Ogawa |
| 5,593,741 A | 1/1997 | Ikeda |
| 5,600,165 A | 2/1997 | Tsukamoto et al. |
| 5,641,607 A | 6/1997 | Ogawa et al. |
| 5,648,202 A | 7/1997 | Ogawa et al. |
| 5,652,187 A | 7/1997 | Kim et al. ................... 437/240 |
| 5,656,330 A | 8/1997 | Niiyama et al. |
| 5,656,337 A | 8/1997 | Park et al. .................. 427/539 |
| 5,661,093 A | 8/1997 | Ravi et al. |
| 5,667,015 A | 9/1997 | Harestad et al. |
| 5,670,297 A | 9/1997 | Ogawa et al. |
| 5,674,356 A | 10/1997 | Nagayama |
| 5,677,015 A | 10/1997 | Hasegawa ................... 427/576 |
| 5,677,111 A | 10/1997 | Ogawa |
| 5,968,324 A | 10/1997 | Cheung et al. |
| 5,691,212 A | 11/1997 | Tsai et al. |
| 5,698,352 A | 12/1997 | Ogawa et al. |
| 5,709,741 A | 1/1998 | Akamatsu et al. |
| 5,710,067 A | 1/1998 | Foote |
| 5,731,242 A | 3/1998 | Parat et al. |
| 5,741,721 A | 4/1998 | Stevens |
| 5,744,399 A | 4/1998 | Rostoker |
| 5,750,442 A | 5/1998 | Juengling |
| 5,753,320 A | 5/1998 | Mikoshiba et al. |
| 5,759,755 A | 6/1998 | Park et al. |
| 5,783,493 A | 7/1998 | Yeh et al. |
| 5,786,039 A | 7/1998 | Brouquet |
| 5,792,689 A | 8/1998 | Yang et al. |
| 5,800,877 A | 9/1998 | Maeda et al. |
| 5,801,399 A | 9/1998 | Hattori et al. |
| 5,807,660 A | 9/1998 | Lin et al. |
| 5,817,549 A | 10/1998 | Yamazaki et al. |
| 5,831,321 A | 11/1998 | Nagayama |
| 5,838,052 A | 11/1998 | McTeer |
| 5,858,880 A | 1/1999 | Dobson et al. |
| 5,872,035 A | 2/1999 | Kim et al. |
| 5,872,385 A | 2/1999 | Taft et al. |
| 5,874,367 A | 2/1999 | Dobson |
| 5,883,014 A | 3/1999 | Chen |
| 5,883,011 A | 4/1999 | Lin et al. |
| 5,933,721 A | 8/1999 | Hause et al. |
| 5,948,482 A | 9/1999 | Brinker et al. |
| 5,960,289 A | 9/1999 | Tsui et al. |
| 5,962,581 A | 10/1999 | Hayase et al. |
| 5,968,611 A | 10/1999 | Kaloyeros et al. |
| 5,981,368 A | 11/1999 | Gardner et al. |
| 5,986,318 A | 11/1999 | Kim et al. |
| 5,994,730 A | 11/1999 | Shrivastava et al. |
| 6,001,741 A | 12/1999 | Alers |
| 6,001,747 A | 12/1999 | Annapragada |
| 6,004,850 A | 12/1999 | Lucas et al. |
| 6,008,121 A | 12/1999 | Yang et al. |
| 6,008,124 A | 12/1999 | Sekiguchi et al. |
| 6,017,779 A | 1/2000 | Miyasaka |
| 6,020,243 A | 2/2000 | Wallace et al. |
| 6,022,404 A | 2/2000 | Ettlinger et al. |
| 6,028,015 A | 2/2000 | Wang et al. |
| 6,040,619 A | 3/2000 | Wang et al. |
| 6,054,379 A | 4/2000 | Yau et al. |
| 6,060,765 A | 5/2000 | Maeda |
| 6,060,766 A | 5/2000 | Mehta et al. |
| 6,071,799 A | 6/2000 | Park et al. |
| 6,072,227 A | 6/2000 | Yau et al. |
| 6,087,064 A | 7/2000 | Lin et al. |
| 6,087,267 A | 7/2000 | Dockrey et al. |
| 6,096,656 A | 8/2000 | Matzke et al. |
| 6,114,255 A | 9/2000 | Juengling |
| 6,124,641 A | 9/2000 | Matsuura |
| 6,130,168 A | 10/2000 | Chu et al. |
| 6,133,096 A | 10/2000 | Su et al. |
| 6,133,613 A | 10/2000 | Yao et al. |
| 6,136,636 A | 10/2000 | Wu |
| 6,140,151 A | 10/2000 | Akram |
| 6,140,677 A | 10/2000 | Gardner et al. |
| 6,143,670 A | 11/2000 | Cheng et al. |
| 6,156,674 A | 12/2000 | Li et al. |
| 6,159,804 A | 12/2000 | Gardner et al. |
| 6,159,871 A | 12/2000 | Loboda et al. |
| 6,184,151 B1 | 2/2001 | Adair et al. |
| 6,184,158 B1 | 2/2001 | Shufflebotham et al. |
| 6,187,657 B1 | 2/2001 | Xiang et al. |
| 6,187,694 B1 | 2/2001 | Cheng et al. |
| 6,198,144 B1 | 3/2001 | Pan et al. |
| 6,200,835 B1 | 3/2001 | Manning |
| 6,204,168 B1 | 3/2001 | Naik et al. |
| 6,209,484 B1 | 4/2001 | Huang et al. |
| 6,225,217 B1 | 5/2001 | Usami et al. |
| 6,235,568 B1 | 5/2001 | Murthy et al. |
| 6,235,591 B1 | 5/2001 | Balasubramanian et al. |
| 6,238,976 B1 | 5/2001 | Noble et al. |
| 6,268,282 B1 | 7/2001 | Sandhu et al. |
| 6,274,292 B1 | 8/2001 | Holscher et al. |
| 6,373,114 B1 | 4/2002 | Jeng et al. |
| 6,403,464 B1 | 6/2002 | Chang |
| 6,440,860 B1 | 8/2002 | DeBoer et al. |
| 6,492,688 B1 | 12/2002 | Ilg |
| 6,498,084 B2 | 12/2002 | Bergemont |

| | | |
|---|---|---|
| 6,518,122 B1 | 2/2003 | Chan et al. |
| 6,627,535 B2 | 9/2003 | MacNeil et al. |
| 6,638,875 B2 | 10/2003 | Han et al. |
| 6,720,247 B2 | 4/2004 | Kirkpatrick et al. |
| 6,723,631 B2 | 4/2004 | Noguchi et al. |
| 2001/0003064 A1 | 6/2001 | Ohto |
| 2001/0019868 A1 | 9/2001 | Gonzalez et al. |
| 2001/0038919 A1 | 11/2001 | Berry, III et al. |
| 2002/0033486 A1 | 3/2002 | Kim et al. |
| 2002/0081834 A1 | 6/2002 | Daniels et al. |
| 2003/0013311 A1 | 1/2003 | Chang et al. |
| 2003/0077916 A1 | 4/2003 | Xu et al. |
| 2003/0207594 A1 | 11/2003 | Catabay et al. |
| 2004/0071878 A1 | 4/2004 | Schuhmacher et al. |

FOREIGN PATENT DOCUMENTS

| | | | |
|---|---|---|---|
| EP | 1 172 845 A2 | 1/2002 | |
| GB | 593.727 | 10/1994 | |
| JP | 63-157443 | 6/1988 | |
| JP | 63 316476 | 12/1988 | |
| JP | 5-263255 | 10/1993 | |
| JP | 06 067019 | 3/1994 | |
| JP | 406244172 A * | 9/1994 | |
| JP | 08 045926 | 2/1996 | |
| JP | 8051058 | 2/1996 | |
| JP | 8078322 | 3/1996 | |
| JP | 08-213386 A | 8/1996 | |
| JP | 9-050993 | 2/1997 | .................. 7/135 |
| JP | 09-055351 | 2/1997 | |
| JP | 10-163083 | 6/1998 | |
| JP | 2000068261 A | 3/2000 | |
| TW | 368687 A | 9/1999 | |
| TW | 420844 A | 2/2001 | |
| TW | 429473 A | 4/2001 | |
| WO | 20029 | 8/1999 | |
| WO | 20030 | 8/1999 | |

OTHER PUBLICATIONS

U.S. application No.09/146,842, Yin et al, filed Sep. 3, 1998.
U.S. application No. 09/234,233, Li et al., filed Jan. 20, 1999.
U.S. application No. 09/200,035, Li, filed Nov. 25,1998.
U.S. application No. 09/388,826, Li et al., filed Sep. 1, 1999.
Matsuura, M., et al., "A Highly Relialbe Self–planarizing Low–k Intermetal Dielectric for Sub–quarter Micron Interconnects", IEEE Jul. 1997, pp. 785–788.
Horie, O., et al., "Kinetics and Mechanism of the Reactions of O($^3$P) with, $SiH_4$, $Ch_3SiH_3$, $(CH_3)_2SiH_2$, and $(CH_3)_3SiH$", J. Phys. Chem. 1991, vol. 95, pp. 4393–4400.
Withnall, R., et al., "Matrix Reactions of Methylsilanes and Oxygen Atoms", J. Phys. Chem. 1988, vol. 92, pp. 594–602.
Joshi, A., et al., "Plasma Deposited Organosilicon Hydride Network Polymers as Versatile Resists for Entirely Dry Mid–Deep UV Photolithography", SPIE vol. 1925, Jan. 1993, pp. 709–720.
Wolf, S., "Silicon Processing for the VLSI Era: vol. 3: The Submicron MOSFET", Lattice Press 1995, p. 635.
Wolf, S., "Silicon Processing for the VLSI Era", vol. 1: Process Technology, Lattice Press 1986, pp. 189–190.
S. Wolf and R.N. Tauber, Silicon Processing for the VLSI Era (vol. 1–Process Technology), Prologue, Pages xxiii.

U.S. patent application Ser. No. 09/773,462, Rolfson et al., filed Jan. 31, 2001.
Weidman T. et al., "–Nc~ Photodefinnble Glass Etch Masks for Entirely Dry Photolithography; Plasma Deposited Organosilicon Hydride Polymers", Appl. Phys. Lett. vol., 62, No. 4, Jan. 25, 1993, pp. 372–374.
Weidman, T. et al., "All Dry Lithography: Applications of Plasma Polymerized Methylsilane as a Single Layer Resist and Silicon Dioxide Precursor", J. Photopolym. Sci. Technol. vol. 8, No. 4, 1995, pp. 679–686.
Joubert, O. et al., "Application of Plasma Polymerized Methylsilane in an All Dry Resist Process for 193 and Z–18nm Lithography", Microlectronic Engineering 30 (1996), pp. 275–278.
McClatchie, S. et al., "Low Dielectric Constant Flowfill" Technology for IMD Applications, Proceed of 3d Internal–Dielectrics for ULSI Multilevel Interconnection Conf. Santa Clara, CA. Feb. 1997, pp. 34–40.
Becknian, K. et al., "Sub–Micron Gap Fill and In–Situ Planarisation Using Flowfill™ Technology", ULSI Conf. Portland, OR, Oct. 1995, pp. 1–7.
Kiermasz A. et al., "Planarisation for sub–Micron Devices Utilising a New Chemistry", DUMIC Conf. California, Feb. 1995, pp. 1–2.
Bencher, C. et al., "Dielectric Antireflective Coatings for DUV Lithography", Solid State Technology, Mar. 1997, pp. 109–114.
Shibata, N., "Plasma–Chemical Vapor–Deposited Silicon Oxide/Silicon Oxynitride Double–Layer Antireflective Coaring for Solar Cells" Jap. Journ. of Applied Physics, vol. 30, No. 5, May 1991, pp. 997–1001.
McKenzie, D., et al., "New Technology for PACVD", Surface and Coatings Technology, vol. 83, 1996, pp. 326–333.
Dammel, R. et al., "Dependence of Optical Constants of AZ'Barli™ Bottom Coating on Bake Conditions", SPIE vol. 3049, 1997. pp. 963–973.
TEXT: Heavens, O., "Optical Properties of Thin Solid Films", pp. 48–49.
TEXT: Jenkins, F. et al., Fundaments of Opitcs, pp. 7–10.
TEXT: Wolf, S. et al . . . "Silicon Processing for the VLSI Era", vol. 1, pp. 437–441.
TEXT: Ralls, K. et al., "Introduction to Materials Science and Engineering", 1976 John Wiley & Sons, Inc., pp. 312–313.
Laxlhan, R. et al., "Synthesizing Low–K CVD Materials for Fab Use", Semiconductor Internail., Nov. 2000, pp. 95–102 (printed from www.semiconductor–intl.com).
Anonymous, "New Gas Helps Make Faster ICs", Machine Design, vol. 71, Iss. 21, Nov. 4, 1999, p. 118.
Abstract: Loboda, M. et al., "Using Trlmethylsilane to Improve Safety, Throughput and Versatlliry in PECVD Processes", Electrochem. Soc. Meeting Abstract No. 358, 191 Meeting, Montreal, Quebec, vol. MA 97–1, 1997.
Hackn's Chemical Dictionary, $4^{th}$ ed. McGraw–Hill Book Co., 1969, p. 27.

* cited by examiner

SEMICONDUCTOR DEVICES, AND SEMICONDUCTOR PROCESSING METHODS

TECHNICAL FIELD

The invention pertains to compositions of matter comprising silicon bonded to both nitrogen and an organic material. The invention further pertains to semiconductor devices incorporating the above-described compositions of matter, and to methods of forming semiconductor devices. In particular aspects, the invention pertains to semiconductor devices incorporating copper-containing materials, and to methods of forming such devices.

BACKGROUND OF THE INVENTION

It would be desirable to employ copper-containing materials in semiconductor devices. Copper has conductive properties that are superior to those of many of the conductive materials presently utilized in semiconductor devices. Unfortunately, copper has a drawback associated with it that it cannot generally be placed against oxide-comprising insulative materials (such as, for example, silicon dioxide). If copper-containing materials are placed adjacent oxide-comprising insulative materials, oxygen can diffuse into the copper-containing material and react to reduce conductivity of the material. Also, copper can diffuse into the oxide-containing material to reduce the insulative properties of the oxide-containing material. Additionally, copper can diffuse through oxide insulative material to device regions and cause degradation of device (e.g., transistor) performance. The problems associated with copper are occasionally addressed by providing nitride containing barrier layers adjacent the copper-containing materials, but such can result in problems associated with parasitic capacitance, as illustrated in FIG. 1. Specifically, FIG. 1 illustrates a fragment of a prior art integrated circuit, and illustrates regions where parasitic capacitance can occur.

The structure of FIG. 1 comprises a substrate 10, and transistor gates 12 and 14 overlying substrate 10. Substrate 10 can comprise, for example, monocrystalline silicon lightly doped with a p-type background conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Transistor gates 12 and 14 can comprise conventional constructions such as overlying layers of gate oxide, polysilicon and silicide. Insulative spacers 16 are formed adjacent transistor gates 12 and 14, and conductively doped diffusion regions 18, 20 and 22 are formed within substrate 10 and proximate gates 12 and 14. Also, isolation regions 24 (shown as shallow trench isolation regions) are formed within substrate 10 and electrically isolate diffusion regions 18 and 22 from other circuitry (not shown) provided within and over substrate 10.

An insulative material 26 extends over substrate 10, and over transistor gates 12 and 14. A conductive plug 28 extends through insulative material 26 to contact conductive diffusion region 20. Conductive plug 28 can comprise, for example, conductively doped polysilicon. Insulative material 26 can comprise, for example, silicon dioxide or borophosphosilicate glass (BPSG). Insulative material 26 and plug 28 together comprise a planarized upper surface 29. Planarized surface 29 can be formed by, for example, chemical-mechanical polishing.

A second insulative material 30 is formed over insulative material 26 and on planarized upper surface 29. Second insulative material 30 can comprise, for example, borophosphosilicate glass or silicon dioxide. A conductive material 32 is formed within an opening in insulative material 30 and over conductive plug 28. Conductive material 32 comprises copper. The copper can be, for example, in the form of elemental copper, or in the form of an alloy. Conductive material 32 is separated from conductive plug 28 by an intervening barrier layer 34. Barrier layer 34 typically comprises a conductive material, such as titanium nitride (TiN) or tantalum nitride (TaN), and is provided to prevent out-diffusion of copper from conductive material 32 into either insulative material 26 or the polysilicon of conductive plug 28. Barrier layer 34 can also prevent diffusion of silicon or oxygen from layers 26, 28 and 30 into the copper of conductive material 32. It is desired to prevent diffusion of oxygen to the copper of material 32, as such oxygen could otherwise reduce conductance of material 32. Also, it is desired to prevent copper diffusion from material 32 into insulative layer 26, as such copper could reduce the insulative properties of the material of layer 26. Additionally, diffusion through layer 26 and into one or more of regions 18, 20 and 22 can reduce the performance of transistor devices.

A second conductive material 36 is provided over insulative material 26 and spaced from first conductive material 32. Second conductive material 36 can comprise, for example, conductively doped polysilicon or a conductive metal, or a combination of two or more conductive materials (such as copper and TiN). Second conductive material 36 is spaced from first conductive material 32 by an intervening region of insulative material 30 and barrier layer 34.

Insulative material 30, barrier layer 34, first conductive material 32 and second conductive material 36 share a common planarized upper surface 37. Planarized upper surface 37 can be formed by, for example, chemical-mechanical polishing.

An insulative barrier layer 38 is provided over planarized upper surface 37. Insulative barrier layer 38 can comprise, for example, silicon nitride.

An insulative layer 40 is provided over insulative barrier layer 38. Insulative layer 40 can comprise, for example, silicon dioxide or BPSG. Insulative barrier layer 38 inhibits diffusion of copper from first conductive material 32 into insulative layer 40, and inhibits diffusion of oxygen from insulative layer 40 into first conductive material 32.

Another insulative layer 42 is provided over insulative layer 40, and a third conductive material 44 is provided within insulative material 42 and over first conductive material 32. Insulative material 42 can comprise, for example, BPSG or silicon dioxide, and third conductive material 44 can comprise, for example, conductively doped polysilicon or a metal, or a combination of two or more conductive materials (such as copper and TiN).

Conductive materials 32, 36 and 44 can be conductive interconnects between electrical devices, or portions of electrical devices. The function of materials 32, 36 and 44 within a semiconductor circuit is not germane to this discussion. Instead, it is the orientation of conductive materials 32, 36 and 44 relative to one another that is of interest to the present discussion. Specifically, each of materials 32, 36 and 44 is separated from the other materials by intervening insulative (or dielectric) materials. Accordingly, parasitic capacitance can occur between the conductive materials 32, 36 and 44. A method of reducing the parasitic capacitance is to utilize insulative materials that have relatively low dielectric constants ("k"). For instance, as silicon dioxide has a lower dielectric constant that silicon nitride, it is generally preferable to utilize silicon dioxide between adjacent conductive components, rather than silicon nitride. However, as discussed previously, copper-containing materials are preferably not provided against silicon dioxide due to diffusion problems that can occur. Accordingly, when copper is utilized as a conductive material in a structure, it must generally be spaced from silicon dioxide-comprising insulative materials to prevent diffusion of oxygen into the copper structure, as well as to prevent diffusion of copper into the oxygen-comprising insulative material. Accordingly, the copper materials are generally surrounded by nitride-comprising materials (such as the shown is barrier layers 34 and 38) to prevent diffusion from the copper materials, or into the copper materials. Unfortunately, this creates the disadvantage of having relatively high dielectric constant nitride materials (for example, the material of layer 38) separating conductive materials. Accordingly, the requirement of nitride-comprising barrier layers can take away some of the fundamental advantage of utilizing copper-comprising materials in integrated circuit constructions.

SUMMARY OF THE INVENTION

In one aspect, the invention encompasses a semiconductor processing method wherein a conductive copper-containing material is formed over a semiconductive substrate and a second material is formed proximate the conductive material. A barrier layer is formed between the conductive material and the second material. The barrier layer comprises a compound having silicon chemically bonded to both nitrogen and an organic material.

In another aspect, the invention encompasses a composition of matter comprising silicon chemically bonded to both nitrogen and an organic material.

In yet another aspect, the invention encompasses a semiconductor processing method. A semiconductive substrate is provided and a layer is formed over the semiconductive substrate. The layer comprises a compound having silicon chemically bonded to both nitrogen and an organic material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
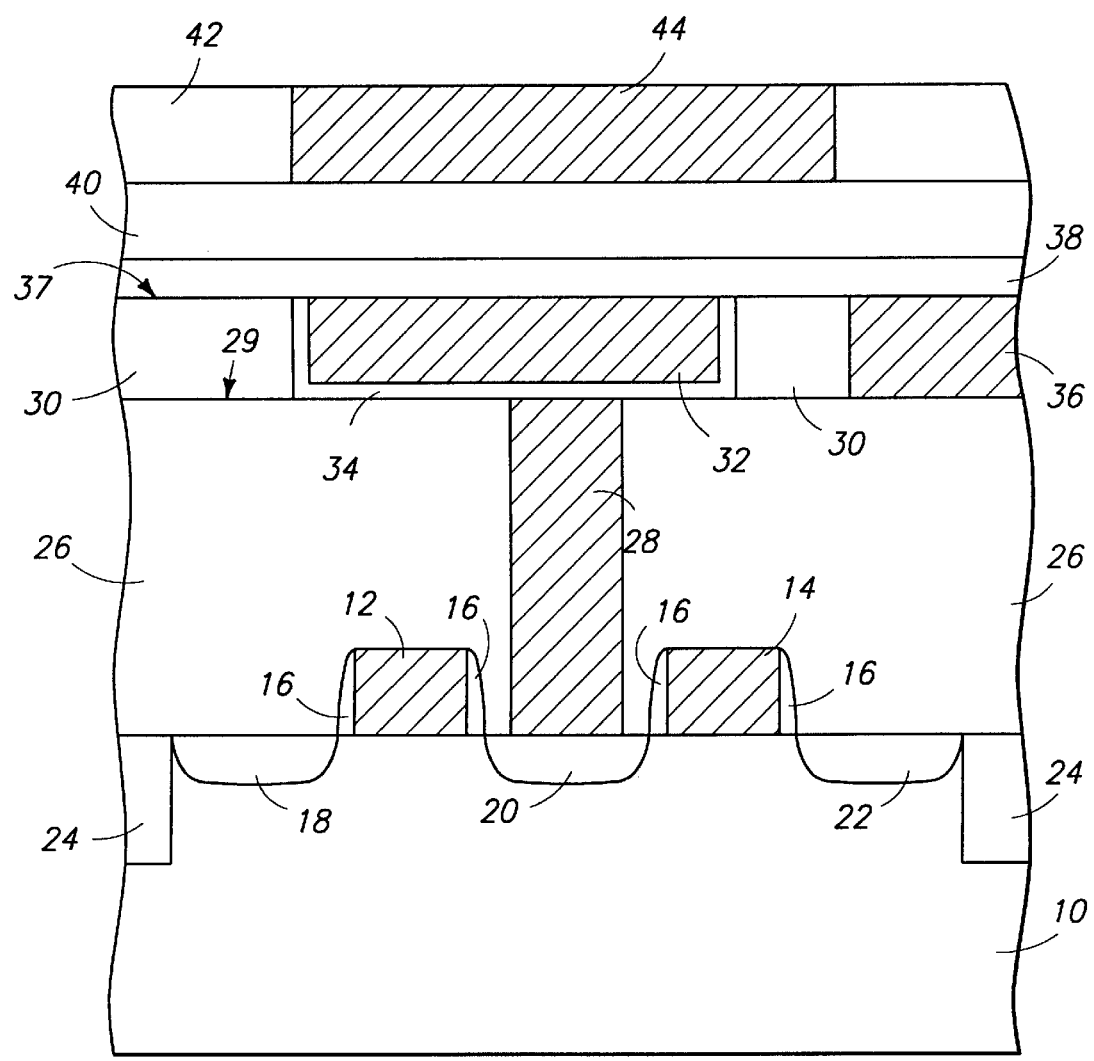
FIG. 1 is a diagrammatic, cross-sectional, fragmentary view of a prior art integrated circuit construction.

This disclosure of the invention is submitted in furtherance of the constitutional purposes of the U.S. Patent Laws "to promote the progress of science and useful arts" (Article 1, Section 8).

In accordance with one aspect of the present invention, a novel composition of matter has been developed which comprises silicon chemically bonded to both nitrogen and an organic material, and wherein the nitrogen is not bonded to carbon. More specifically, the silicon is chemically bonded to both nitrogen and carbon. The carbon can be, for example, in the form of a hydrocarbon. In a preferred aspect, the carbon is comprised by a methyl group and the composition of matter consists essentially of $(CH_3)_x Si_3 N_{(4-x)}$, wherein x is greater than 0 and no greater than about 4.

A composition of the present invention can be formed by, for example, reacting inorganic silane with one or more of ammonia ($NH_3$), hydrazine ($N_2H_4$), or a combination of nitrogen ($N_2$) and hydrogen ($H_2$). The reaction can occur with or without a plasma. However, if the reaction comprises an organic silane in combination with dinitrogen and dihydrogen, the reaction preferably occurs in the presence of plasma.

An exemplary reaction is to combine methylsilane ($CH_3SiH_3$) with ammonia ($NH_3$) in the presence of a plasma to form $(CH_3)_x Si_3 N_{4-x}$. The exemplary reaction can occur, for example, under the following conditions. A substrate is placed within a reaction chamber of a reactor, and a surface of the substrate is maintained at a temperature of from about 0° C. to about 600° C. Ammonia and methylsilane are flowed into the reaction chamber, and a pressure within the chamber is maintained at from about 300 m Torr to about 30 Torr, with a plasma at radio frequency (RF) power of from about 50 watts to about 500 watts. A product comprising $(CH_3)_x Si_3 N_{(4-x)}$ is then formed and deposited on the substrate. The reactor can comprise, for example, a cold wall plasma reactor.

It is found that the product deposited from the described reaction consists essentially of $Si_3 N_y$ and $(CH_3)_x Si_3 N_{(4-x)}$, (wherein y is generally about 4/3, and x is also generally about 4/3). The $(CH_3)_x Si_3 N_{(4-x)}$ is present in the product to a concentration of from greater than 0% to about 50% (mole percent), and is preferably from about 10% to about 20%. The amount of $(CH_3)_x Si_3 N_{(4-x)}$ present in the product can be adjusted by providing a feed gas of $SiH_4$ in the reactor in addition to the $CH_3SiH_3$, and by varying a ratio of the $SiH_4$ to the $CH_3SiH_3$, and/or by adjusting RF power.

The compositions of matter encompassed by the present invention are found to be insulative, and to have lower dielectric constants than silicon nitride. Accordingly, compositions of the present invention can be substituted for silicon nitride in barrier layers to reduce parasitic capacitance between adjacent conductive components. FIG. 2 illustrates a fragment of an integrated circuit incorporating a composition of the present invention. In referring to FIG. 2, similar numbering to that utilized above in describing the prior art structure of FIG. 1 will be used, with differences indicated by different numerals.

Figure 2:
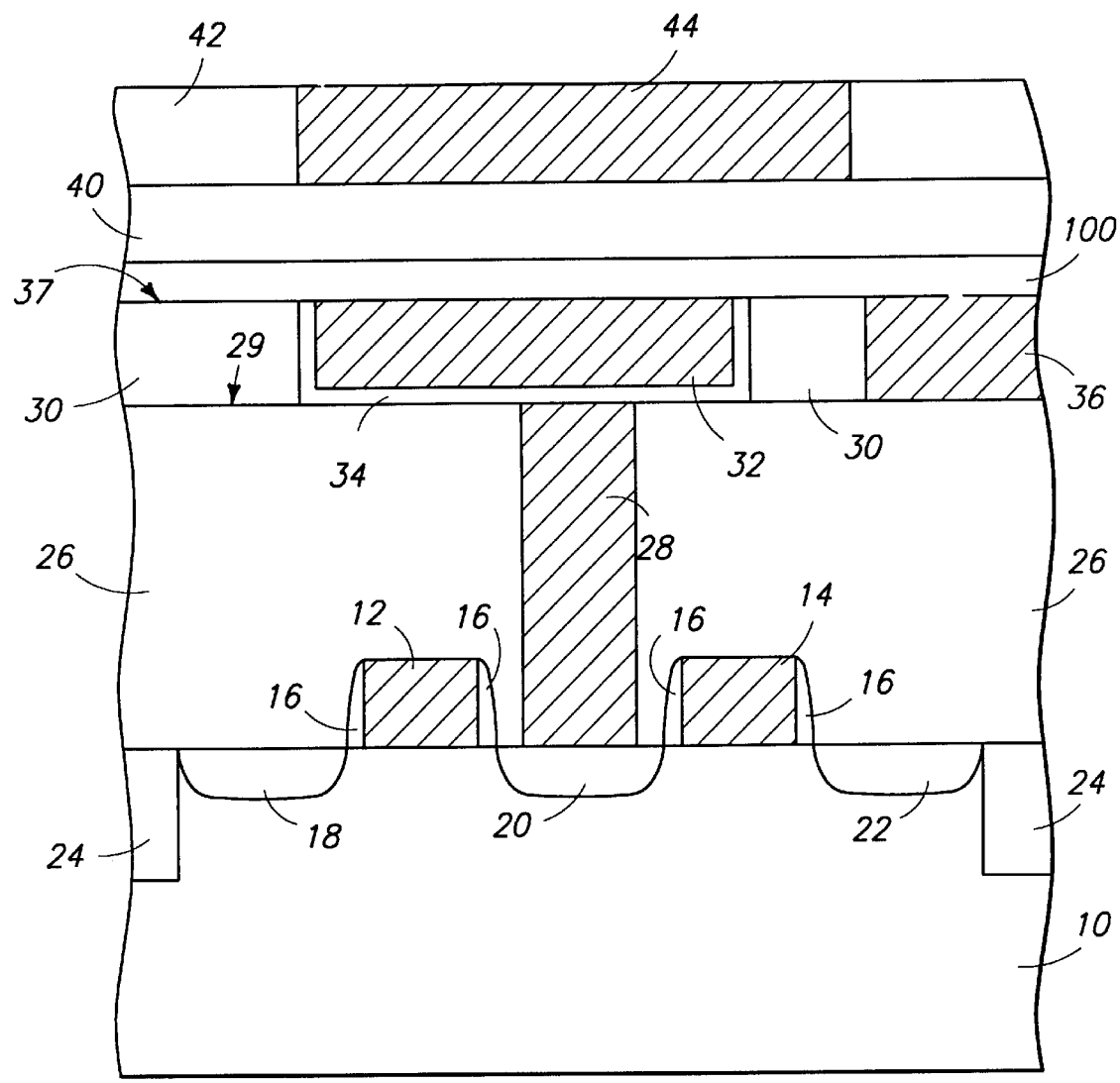
FIG. 2 is a diagrammatic, cross-sectional, fragmentary view of an integrated circuit construction encompassed by the present invention.

The structure of FIG. 2 differs from the prior art structure of FIG. 1 in that FIG. 2 illustrates a barrier layer 100 in place of the silicon nitride barrier layer 38 of FIG. 1. Layer 100 can comprise, for example, an above-described novel composition of the present invention, such as, for example, $(CH_3)_x Si_3 N_{(4-x)}$. Alternatively, layer 100 can comprise a composition which includes carbon, silicon and nitrogen, and wherein the nitrogen is bonded to carbon. Layer 100 is proximate conductive material 32 (actually against conductive material 32) and separates second conductive material 44 from first conductive material 32. In the construction shown in FIG. 2, barrier layer 100 separates conductive material 32 from an insulative material 40 to impede migration of oxide from insulative material 40 into copper of a preferred conductive material 32, as well as to impede migration of copper from preferred material 32 into insulative material 40.

Figure 3:
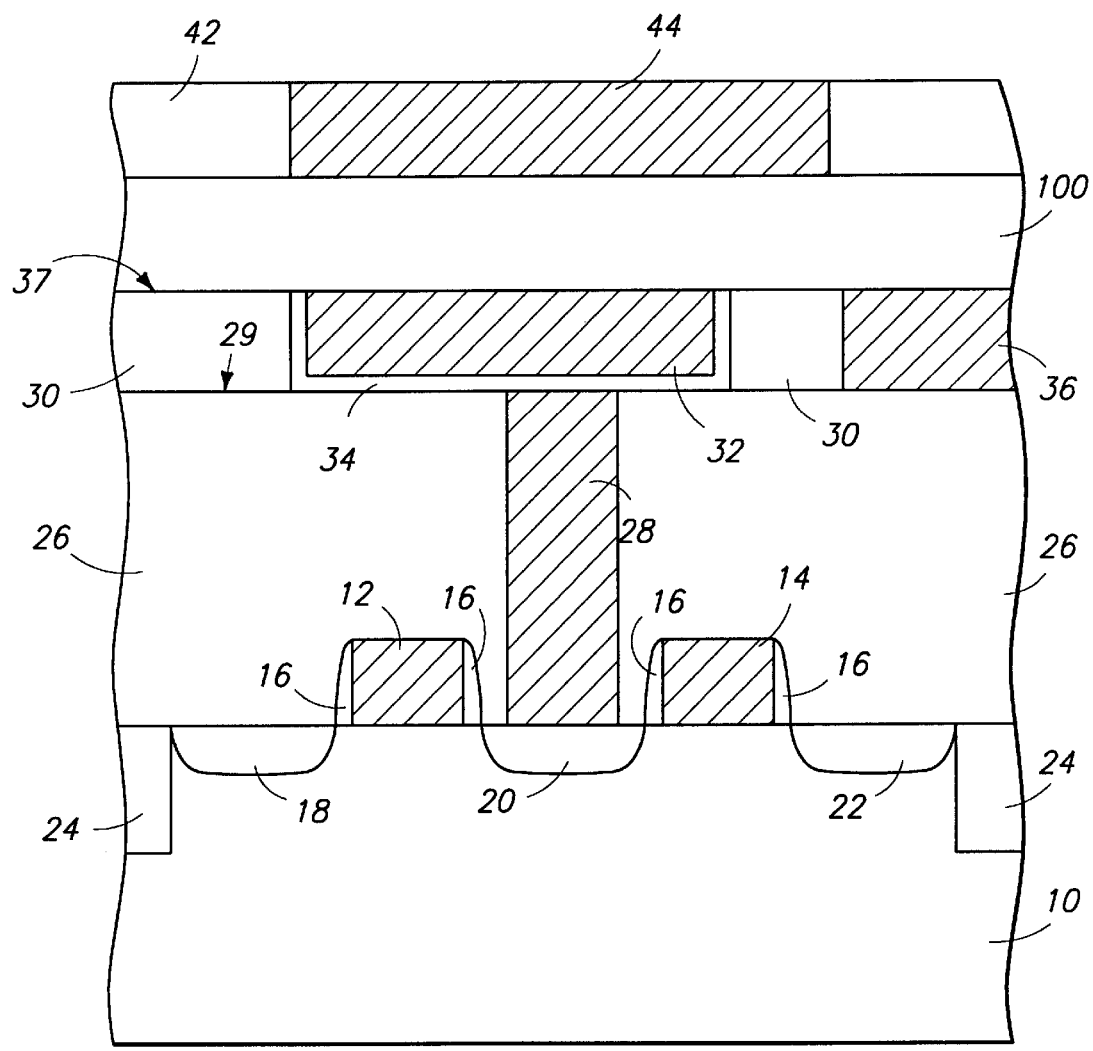
FIG. 3 is a diagrammatic, cross-sectional, fragmentary view of another embodiment integrated circuit construction encompassed by the present invention.

FIG. 3 illustrates an alternate embodiment semiconductor construction of the present invention (with numbering identical to that utilized in FIG. 2), wherein insulative material 40 (FIG. 2) is eliminated. Barrier layer 100 is thus the only material between first conductive material 32 and second conductive material 44, and is against both conductive material 32 and conductive material 44.

In exemplary embodiments of the present invention, barrier layer 100 comprises $(CH_3)_xSi_3N_{(4-x)}$ (wherein "X" is from about 1 to about 4, and preferably wherein "X" is about 0.7). Such barrier layer 100 can be formed by the methods discussed above, and can, for example, consist essentially of $Si_3N_y$ and $(CH_3)_xSi_3N_{(4-x)}$. Also, an amount of $(CH_3)_xSi_3N_{(4-x)}$ within barrier layer 100 can be adjusted by the above-discussed methods of adjusting a ratio of $SiH_4$ and $CH_3SiH_3$ during formation of the layer. An exemplary concentration of $(CH_3)_xSi_3N_{(4-x)}$ within barrier layer 100 is from greater than 0% to about 20% (mole percent).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
   forming a conductive copper-containing material over a semiconductive substrate;
   forming a second material proximate the conductive material; and
   forming a barrier layer between the conductive material and the second material, the barrier layer comprising $(CH_3)_xSi_3N_{(4-x)}$, with x being greater than 0 and no greater than 4.

2. The method of claim 1 wherein conductive material consist essentially of copper.

3. The method of claim 1 wherein the barrier layer is against the conductive material.

4. The method of claim 1 wherein the barrier layer is against both the conductive material and the second material.

5. The method of claim 1 wherein the second material is an insulative material.

6. A semiconductor processing method, comprising:
   forming a conductive copper-containing material over a semiconductive substrate;
   forming a second material proximate the conductive material;
   forming a barrier layer between the conductive material and the second material, the barrier layer comprising a compound having silicon chemically bonded to both nitrogen and an organic material, the barrier layer being in physically contact with the second material; and
   wherein the second material comprises silicon dioxide.

7. The method of claim 1 wherein the barrier layer consists essentially of $Si_3N_y$ and the $(CH_3)_xSi_3N_{(4-x)}$, and wherein y is greater than 0 and no greater than about 4.

8. The method of claim 1 wherein the barrier layer consists essentially of $Si_3N_y$ and the $(CH_3)_xSi_3N_{(4-x)}$, wherein y is greater than 0 and no greater than about 4, and wherein the $(CH_3)_xSi_3N_{(4-x)}$ is present in the barrier layer to a concentration of from greater than 0% to about 20% (mole percent).

9. The method of claim 1 wherein the forming the barrier layer occurs in a reaction chamber and comprises combining $CH_3SiH_3$ and $NH_3$ in the chamber to deposit the $(CH_3)_xSi_3N_{(4-x)}$ over the substrate.

10. The method of claim 1 wherein the forming the barrier layer occurs in a reaction chamber and comprises combining $CH_3SiH_3$ and $NH_3$ in the chamber with a plasma to deposit the $(CH_3)_xSi_3N_{(4-x)}$ over the substrate.

11. The method of claim 1 wherein the barrier layer consists essentially of $Si_3N_y$ and the $(CH_3)_xSi_3N_{(4-x)}$, and wherein the forming the barrier layer occurs in a reaction chamber and comprises combining $CH_3SiH_3$, $SiH_4$ and $NH_3$ in the chamber with a plasma to deposit the $(CH_3)_xSi_3N_{(4-x)}$ over the substrate, and wherein y is greater than 0 and no greater than about 4.

12. A semiconductor processing method, comprising:
   providing a semiconductive substrate;
   forming a first material over the semiconductive substrate;
   forming a barrier layer proximate the first material, the barrier layer comprising $(CH_3)_xSi_3N_{(4-x)}$, with x being greater than 0 and no greater than 4; and
   forming a second material separated from the first material by the barrier layer.

13. The method of claim 12 wherein the barrier layer is formed against the first material.

14. The method of claim 12 wherein the barrier layer is formed against the first material, and wherein the second material is formed against the barrier layer.

15. The method of claim 12 wherein at least one of the first and second materials is conductive.

16. The method of claim 12 wherein at least one of the first and second materials is insulative.

17. The method of claim 12 wherein the barrier layer consists essentially of $Si_3N_y$ and the $(CH_3)_xSi_3N_{(4-x)}$, and wherein y is greater than 0 and no greater than about 4.

18. A semiconductor processing method, comprising:
   providing a semiconductive substrate; and
   forming a layer over the semiconductive substrate, the layer comprising $(CH_3)_xSi_3N_{(4-x)}$, with x being greater than 0 and no greater than 4.

19. The method of claim 18 wherein the layer consists essentially of $Si_3N_y$ and the $(CH_3)_xSi_3N_{(4-x)}$, and wherein y is greater than 0 and no greater than about 4.

20. The method of claim 18 wherein the layer consists essentially of $Si_3N_y$ and the $(CH_3)_xSi_3N_{(4-x)}$, wherein the $(CH_3)_xSi_3N_{(4-x)}$ is present in the layer to a concentration of from greater than 0% to about 20% (mole percent), and wherein y is greater than 0 and no greater than about 4.

21. The method of claim 18 wherein the forming occurs in a reaction chamber and comprises combining $CH_3SiH_3$ and $NH_3$ in the chamber to deposit the $(CH_3)_xSi_3N_{(4-x)}$ over the substrate.

22. The method of claim 18 wherein the forming occurs in a reaction chamber and comprises combining $CH_3SiH_3$ and $NH_3$ in the chamber with a plasma to deposit the $(CH_3)_xSi_3N_{(4-x)}$ over the substrate.

23. The method of claim 18 wherein the layer consists essentially of $Si_3N_y$ and the $(CH_3)_xSi_3N_{(4-x)}$, and wherein the forming occurs in a reaction chamber and comprises combining $CH_3SiH_3$, $SiH_4$ and $NH_3$ in the chamber with a plasma to deposit the $(CH_3)_xSi_3N_{(4-x)}$ over the substrate.

24. A semiconductor device, comprising:
a semiconductive substrate; and
a layer over the semiconductive substrate, the layer comprising $(CH_3)_x Si_3 N_{(4-x)}$, with x being greater than 0 and no greater than 4.

25. The device of claim 24 wherein the layer consists essentially of $Si_3 N_y$ and the $(CH_3)_x Si_3 N_{(4-x)}$, and wherein y is greater than 0 and no greater than about 4.

26. The device of claim 24 wherein the layer consists essentially of $Si_3 N_y$ and the $(CH_3)_x Si_3 N_{(4-x)}$, wherein the $(CH_3)_x Si_3 N_{(4-x)}$ is present in the layer to a concentration of from greater than 0% to about 50% (mole percent), and wherein y is no greater than about 4.

27. A semiconductor device, comprising:
a semiconductive substrate;
a first material over the semiconductive substrate;
a second material proximate the first material; and
a barrier layer separating the second material from the first material, the barrier layer comprising $(CH_3)_x Si_3 N_{(4-x)}$, with x being greater than 0 and no greater than 4.

28. The device of claim 27 wherein at least one of the first and second materials is conductive.

29. The device of claim 27 wherein the nitrogen is not bonded to carbon.

30. The device of claim 27 wherein at least one of the first and second materials is insulative.

31. The device of claim 27 wherein the barrier layer consists essentially of $Si_3 N_y$ and the $(CH_3)_x Si_3 N_{(4-x)}$, and wherein y is no greater than about 4.

32. A semiconductor device, comprising:
a semiconductive substrate;
a conductive copper-containing material over the semiconductive substrate;
a second material proximate the conductive material; and
a barrier layer between the conductive material and the second material, the barrier layer comprising $(CH_3)_x Si_3 N_{(4-x)}$, with x being greater than 0 and no greater than 4.

33. The device of claim 32 wherein the barrier layer is against the conductive material.

34. The device of claim 32 wherein the barrier layer is against both the conductive material and the second material.

35. The device of claim 32 wherein the second material is an insulative material.

36. A semiconductor device, comprising:
a semiconductive substrate;
a conductive copper-containing material over the semiconductive substrate;
a second material proximate the conductive material;
a barrier layer between the conductive material and the second material, the barrier layer comprising a compound having silicon chemically bonded to both nitrogen and an organic material, the barrier layer being in physical contact with the second material; and
wherein the second material comprises silicon dioxide.

37. The device of claim 32 wherein the barrier layer consists essentially of $Si_3 N_y$ and the $(CH_3)_x Si_3 N_{(4-x)}$, and wherein y is no greater than about 4.

38. The device of claim 32 wherein the barrier layer consists essentially of $Si_3 N_y$ and the $(CH_3)_x Si_3 N_{(4-x)}$, wherein the $(CH_3)_x Si_3 N_{(4-x)}$, is present in the layer to a concentration of from greater than 0% to about 50% (mole percent), and wherein y is no greater than about 4.

* * * * *

UNITED STATES PATENT AND TRADEMARK OFFICE
CERTIFICATE OF CORRECTION

PATENT NO. : 6,828,683 B2 Page 1 of 1
APPLICATION NO. : 09/219041
DATED : December 7, 2004
INVENTOR(S) : Li et al.

It is certified that error appears in the above-identified patent and that said Letters Patent is hereby corrected as shown below:

Item (56) Refereces Cited, Page 3, Other Publications – Replace "Weidman T. et al., "-Nc~" with --Weidman T. et al., "New--.

Item (56) References Cited, Page 3, Other Publications – Replace "TEXT: Jenkins, F. et al., Fundaments" with --TEXT: Jenkins, F. et al., Fundamentals--.

Item (56) References Cited, Page 3, Other Publications – Replace "Laxlhan, R. et al." with --Laxman et al.--.

Item (56) References Cited, Page 3, Other Publications – Replace "Hackn's Chemical Dictionary" with --Hackh's Chemical Dictionary--.

Column 3, Line 21 – Replace "the shown in barrier layers 34" with --the shown barrier layers 34--.

Column 4, Line 22 – Replace "$(CH_3)_xSi_3N_{4-x}$" with --$(CH_3)_xSi_3N_{(4-x)}$--.

Column 5, Line 63, Claim 6 – Replace "in physically contact" with --in physical contact--.

Signed and Sealed this

Fourth Day of September, 2007

JON W. DUDAS
*Director of the United States Patent and Trademark Office*